United States Patent [19]

Hammer et al.

[11] 3,914,706

[45] Oct. 21, 1975

[54] FREQUENCY ADJUSTMENT OF TIMEKEEPERS

[75] Inventors: Walter Hammer, Boudry; Eric Andre Vittoz, Cernier, both of Switzerland

[73] Assignee: Centre Electronique Horloger, S.A., Neuchatel, Switzerland

[22] Filed: Sept. 3, 1974

[21] Appl. No.: 502,990

Related U.S. Application Data

[63] Continuation of Ser. No. 297,074, Oct. 12, 1972.

[30] Foreign Application Priority Data

Oct. 15, 1971 Switzerland........................ 15118/70

[52] U.S. Cl..................................... 331/1 A; 331/16

[51] Int. Cl.[2]........................................... H03B 3/04

[58] Field of Search............ 331/1 A, 15, 16, 17, 51

[56] References Cited

UNITED STATES PATENTS 3,364,439 1/1968 Cohen et al. ......................... 331/17

*Primary Examiner*—John Kominski

*Attorney, Agent, or Firm*—Stevens, Davis, Miller & Mosher

[57] ABSTRACT

A timekeeper comprises a quartz oscillator supplying a stable but not well defined input signal to an adjustable frequency divider, means for comparing the frequency of the output signal of the divider with a reference frequency of a standard signal applied during one period of the reference frequency, means for computing as a function of the measured difference the value of the division ratio necessary for the divider output frequency to be equal to the reference frequency, and means for acting on the divider via an electrically alterable store in order to set the division ratio at said computed value.

5 Claims, 5 Drawing Figures

FREQUENCY ADJUSTMENT OF TIMEKEEPERS

This is a continuation of application Ser. No. 297,074, filed Oct. 12, 1972, now abandoned.

This invention relates to time keeping instruments, of the type comprising an oscillator connected to an adjustable frequency divider, as well as to a process for converting a stable but not well defined base frequency into a lower precisely defined reference frequency.

Most time keeping instruments comprise as time base an oscillator associated with means for adjusting its frequency of oscillation. Adjustment of the oscillator frequency involves certain difficulties and the necessary interaction between the time base and the adjustment means degrades the frequency stability of the former. For example, if the time base comprises a quartz oscillator, it is necessary to adjust its resonant frequency in at least two different operations: firstly, a mechanical operation for coarse adjustment; secondly a fine adjustment, for example by vacuum deposition. These operations are expensive and may degrade the long term stability of the quartz oxcillator. Moreover, the oscillator still has to be adjustable by some additional means, for example a trimmer capacitor, in order to correct the frequency drift due to ageing. This trimmer capacitor is a separate component, which may be sensitive to environmental changes, to humidity, and so on.

A different way of adjusting the output frequency of the frequency divider is to modify the division ratio of the frequency divider. Adjustment by feedback (retroaction) on an inhibitor circuit or on the frequency divider does not require mechanical adjustment of the time base and the stability of the system is not deteriorated. However, these solutions require either an analog type circuit which permits adjustment by feedback, or a system of interconnections between the divider stages, which has to be outside the integrated circuit to provide a digital adjustment of the feedback.

In the former case, the range of adjustment is limited by the precision of the analog element and, moreover, this element outside the integrated circuit is sensitive to humidity and other external influences.

In the latter case, the range of adjustment is limited by the complexity of the system of connection and/or by the number of feedback elements required.

In order to eliminate these drawbacks, a frequency division system of doubtless interest is a system able to automatically learn the frequency division ratio necessary to deliver a desired output frequency. Such a system with learning capability is only possible if an alterable memory is available. This memory is required to store the information which has been obtained during the learning process, in the present case, the dividion ratio.

Such a system is described in U.S. Pat. No. 3,364,439 (Cohen), comprising phase lock loop circuits, in which a phase comparison is made between a reference signal and the output signal, followed by a modification of the division ratio in order to alter the frequency of the output signal. If this operation is repeated a sufficient number of times, the phase difference between the two signals is reduced to zero. A zero phase difference also means that the frequencies of the reference signal and the output signal are identical. The circuits described in the above mentioned patent therefore provide a phase synchronization of an output signal with respect to a permanently received reference signal. This phase synchronization principle requires that the reference signal be applied for a large number of periods. It therefore requires a very long synchronization time (as is examplified in FIG. 7 of above mentioned patent). This system is designed to work with the reference signal permanently available, except for short accidental interruptions of the connection.

The aim of the present invention is to eliminate all or part of the above mentioned drawbacks and to offer new advantages such as an automatic adjustment of an ouput frequency after a short learning period requiring a coupling with a reference signal during only one period of this signal, and to provide a combination of the different elements of the system in order to simplify its implementation.

According to the invention, a time keeping instrument comprises an oscillator connected to an adjustable frequency divider, an alterable memory connected to the divider and having at least one input terminal by which a number may be introduced into the memory, a frequency comparator with a first input connected to an output of the divider, a second input which can be temporarily connected to a reference signal, and an output connected to said input terminal of the memory, said frequency comparator including means for comparing the frequency of the reference signal with the frequency of the divider output signal and for computing the number to be fed to the input terminal of the memory in order to make the divider output signal frequency equal to the reference signal frequency.

According to another aspect of the invention, a process for converting a base frequency into a lower frequency of predetermined value by means of an adjustable frequency divider comprises setting the division ratio of the divider at a nonadjusted value determined by a corresponding non-adjusted value supplied by an alterable memory, converting the base frequency into an unadjusted output frequency of the divider, providing a standard signal corresponding to one period of a nominal frequency to be obtained at the output of the divider, comparing the unadjusted output frequency of the divider with the standard signal frequency, computing from the measured difference the adjusted value of the division ration necessary to make the divider output frequency equal to the standard signal frequency, and introducing said adjusted value into said alterable memory in order to obtain the required division ratio.

With the time keeping instrument and the process according to the invention, measurement of the oscillator frequency before inscription in the memory of the value of the division ratio is avoided, and comparison is carried out automatically when the system is connected to a reference signal of precise frequency. This operation computes the value of the division ratio to be inscribed in the memory so that the frequency of the output signal is made equal to the standard frequency. A complete system of this type requires only one input I, one output S, and one input for the standard signal.

The invention will now be particularly described, by way of example, with reference to the accompanying drawings, in which.

Figure 1:
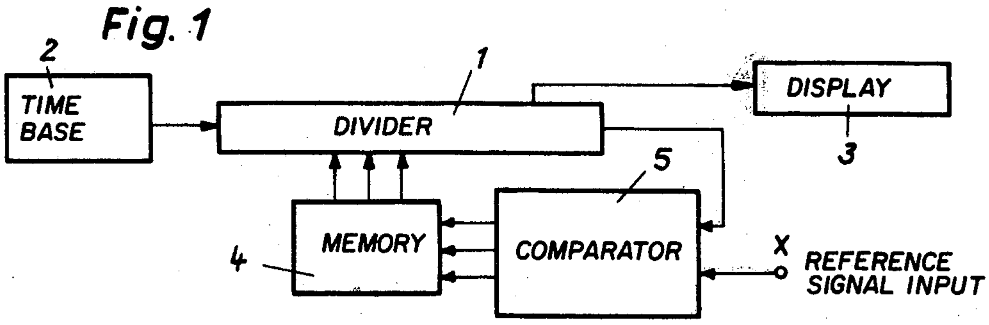
FIG. 1 is a block diagram of a time keeper according to the invention.

The timekeeper shown in FIG. 1 comprises an adjustable divider 1 fed by a time base 2 and having one of its outputs connected to a display device 3. The division ratio of divider 1 is controlled by an electrically alterable memory 4 connected to the output of a frequency comparator 5 arranged to compare two frequencies and to provide a value to be stored in memory 4 in order to adjust the divider output frequency with respect to a standard frequency. For this purpose, a second output of the divider is connected to a first input of the comparator, whose second input X is adapted to receive a standard signal of a well determined frequency. The divider shown in FIG. 1 operates as follows:

Let us suppose that a known value is introduced into the memory 4 at the beginning of the adjustment process. The time base 2 feeds the divider 1 which divides by a known ratio according the value stored in the memory 4. The divider output frequency is then compared with the frequency of a standard signal applied to the input X of the frequency comparator 5. This comparator determines the new value to be stored in the memory 4 in order to adjust the division ratio and to make the divider output frequency equal to the reference frequency.

For correct adjustment of the divider, it is clear that the frequency of the standard signal must be exact and strictly constant. This stable frequency standard signal may be obtained from a temperature stabilised quartz oscillator. In the case where the system schematically shown in FIG. 1 is used in an electronic watch stabilised by a quartz, a separate adjustment apparatus is provided formed by a quartz oscillator and a dividing chain supplying a standard output signal with a frequency of 0.5 Hz for example. The adjustment of this oscillator is carried out mechanically on the encapsuled quartz and a trimmer capacitor is provided in the quartz oscillator circuit for final fine adjustment and for compensation of ageing effects. Finally, the apparatus is temperature stabilised in a manner to provide a strictly constant output signal exactly equal to 0.5 Hz.

Figure 2:
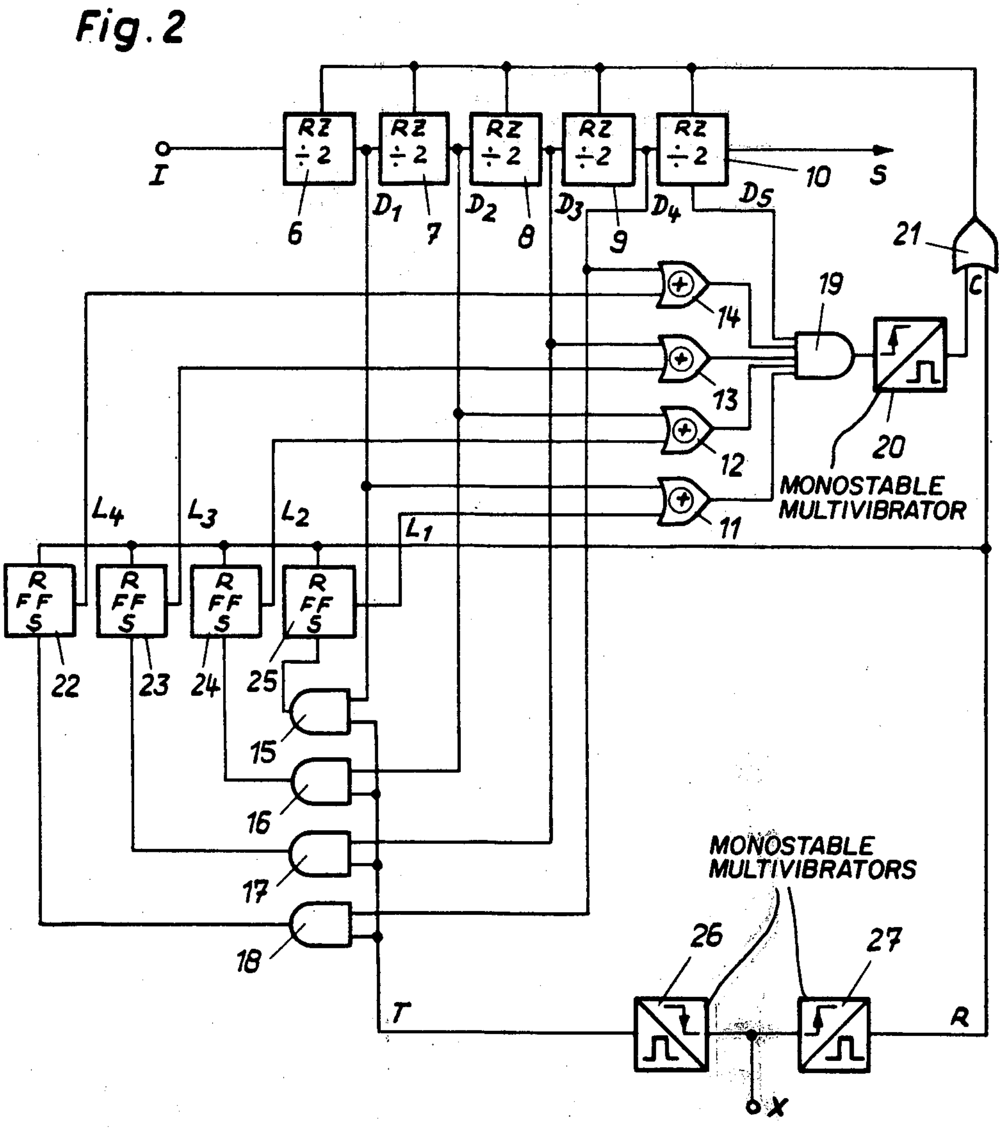
FIG. 2 is a circuit diagram of an embodiment of the timekeeper of FIG. 1, in which the frequency comparator and the divider are combined.

The timekeeper shown in FIG. 2 comprises five binary divider stages 6, 7, 8, 9 and 10, the outputs $D_1$ to $D_4$ of stages 6, 7, 8 and 9 being connected on the one hand to first inputs of four "modulo two" gates 11, 12, 13 and 14 and on the other hand to first inputs of four AND gates 15, 16, 17, 18. The outputs of gates 11 to 14 lead to the inputs of an AND gate 19 whose output is connected to a monopulser 20 which is in turn connected to a first input of an OR gate 21. The output of OR gate 21 is connected to the reset inputs RZ of the five dividing stages 6 to 10. The output $D_5$ of stage 10 is directly connected to an input of AND gate 19.

The outputs of AND gates 15 to 18 are connected to a memory formed from four RS flips-flops 22, 23, 24 and 25, whose outputs are directly connected to the second inputs of the "modulo two" gates 11 to 14. An input terminal X intended to receive the standard signal is connected on the one hand to a monopulser 26 whose output T is connected to the second inputs of AND gates 15 to 18 and, on the other hand, to another monopulser 27 whose output R is connected to a second input of the OR gate 21 and to the reset inputs R of the RS flip-flops 22 to 25 which constitute the memory.

The first divider stage also comprises an input 1 which, in the case of use in an electronic watch, is connected to a time base, for example a quartz oscillator, and the last divider stage comprises an output S connected to a display device.

The divider of FIG. 2 operates as follows:

When the standard signal is not applied at X, the frequency divider formed of stages 6–10 counts the input pulses I up to the moment when the count is the same as the binary number ("1", $L_4$, $L_3$, $L_2$, $L_1$) partially contained in the memory formed of the RS flip-flops 22–25. At this moment, the comparison circuit formed of the "modulo two" gates 11–14 acts on the frequency divider and sets it to zero. The division ratio is thus equal to ("1", $L_4$, $L_3$, $L_2$, $L_1$) and is not modified. The outputs R and T of monopulsers 26 and 27 are at "0".

When the standard signal X is applied, three operations take place successively:

- When X switches from "0" to "1" : the stores and dividers are set to zero.
- While X has value "1": the dividers count the pulses I, and consequently act as a frequency comparator.
- When X switches from "1" to "0": the content of the dividers is transferred by means of the AND gates into the memory, then the dividing chain is set to zero. The content of the dividers that is transferred into the memory is equal to the number of pulses I which occured during application of the standard signal. This is the desired value of the division ratio.

Figure 3:
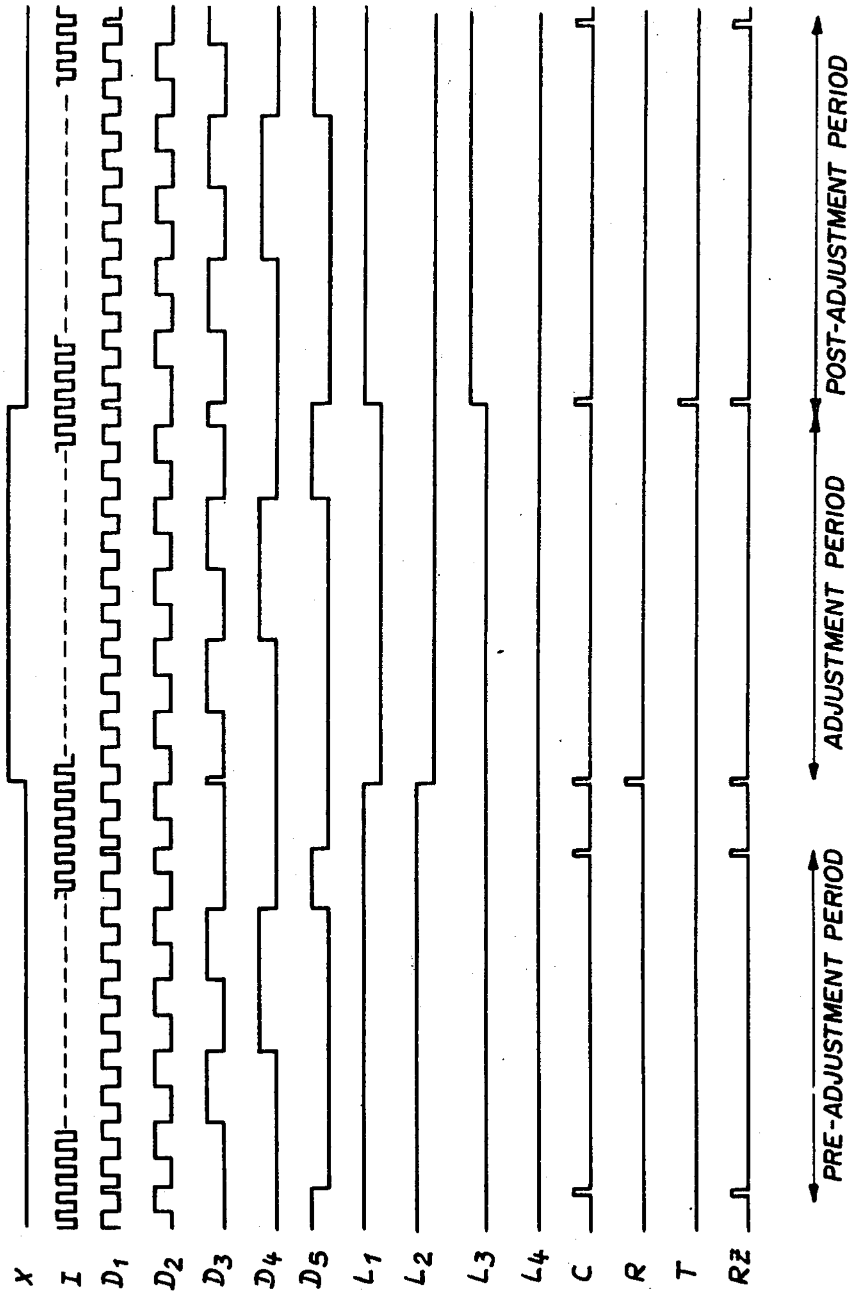
FIG. 3 is an explanatory diagram illustrating operation of the timekeeper of FIG. 2.

FIG. 3 shows the waveform of all of the inputs and outputs of the principal elements of the timekeeper of FIG. 2 during operation.

The automatic adjustment as a function of a standard signal may be completed by a correction of the division ratio as a function of various parameters. In the block diagram of FIG. 4, a temperature compensation is shown.

The time base is a quartz, and it is known that the frequency thereof varies as a function of the temperature. It is nevertheless possible to adjust the division ratio of our system so as to obtain a fixed output frequency.

A temperature sensor is required, giving in binary code either the difference in temperature with respect to a fixed temperature, or directly giving the frequency difference of the quartz compared to its nominal frequency at a reference temperature, or even giving the variation (reduction) of the division ratio required to provide a given output frequency compared to the division ratio required at a nominal temperature (inversion point).

In any case, the binary coded value obtained from the temperature sensor is fed to a compiler together with the stored values $L_i$ in order to determine the required division ratio. For the last mentioned case, the compiler is simply a binary subtractor; this element being shown in FIG. 4 as a block. The remaining part of the system operates in a similar manner to the system of FIG. 2.

Figure 4:
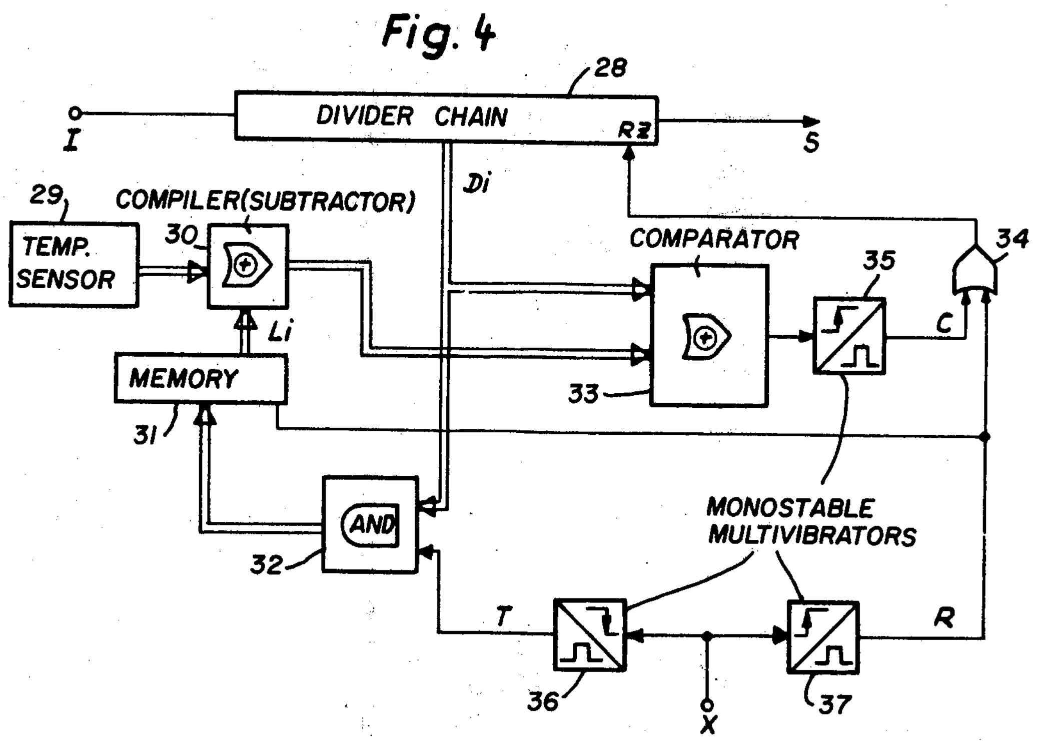
FIG. 4 is a block diagram of a first variant of the timekeeper of FIG. 2.

The time-keeper of FIG. 4 comprises a chain of binary dividers 28 provided with an input I and an output S, a reset-to-zero input RZ for all the dividing stages, and outputs Di from each dividing stage connected on one hand to first inputs of a comparison circuit 33, and on the other hand to first inputs of a circuit comprising AND gates 32. The output comparator circuit 33 controls a single pulse generator (monostable multivibrator) 35, the output C of which is connected to the first input of an OR gate 34, the output of which is connected to input RZ of the dividing chain.

An input terminal X which is fed the reference signal is connected on one hand to a single pulse generator (monostable) 36, the output T of which is connected to the second inputs of the AND gates 32, and on the other hand to a single pulse generator (monostable) 37, the output R of which is connected to the second input of the OR gate 34 and to the reset-to-zero input of memories 31. The latters' storage inputs are controlled by the outputs from the AND gates 32, and their outputs Li are connected to first inputs of a subtractor 30, the second inputs being connected to a temperature sensor 29; the outputs of subtractor 30 are connected to the second inputs of the comparator circuit 33.

The time-keeper of FIG. 4 operates as follows:

When there is no reference signal at input X, the dividing chain 28 will count the pulses applied at input I until the count equals the binary number supplied by subtractor 30 to comparator 33. At that time, comparator 33 will act on the dividing chain by means of monostable 35 and OR gate 34 to reset it to zero. The division ratio therefore equals the binary number supplied by the subtrator. This binary number is equal to the storage of the memories less the value from the temperature sensor. Now the memory storage equals the nominal quartz frequency (at the inversion point), and the value from the temperature sensor equals the quartz frequency reduction at the temperature under consideration with respect to this frequency at the inversion point temperature. The binary number supplied by the subtractor then will equal the quartz temperature at the temperature under consideration. The output frequency from the dividing chain therefore will always equal 1 Hz, regardless of temperature.

When the reference signal X is applied, three successive operations will allow the memory 31 to store the nominal quartz frequency value:

- storage and dividers are reset to zero when X passes from "0" to "1".
- when X = 1, the dividers count the pulses from I and operate as frequency comparators.
- when X passes from "1" to "0", the dividers' content is transmitted by means of AND gates 32 into memory 31, then reset to zero. The transmitted content of the dividers equals the number of pulses appearing during application of the reference signal. It is the desired value of the division ratio.

For the highest possible accuracy, the frequency adjustment process has to be carried out at the nominal temperature (inversion point) of the quartz oscillator in order to avoid any influence of the temperature compensation device during this operation, and to maintain the quartz at the right temperature.

Figure 5:
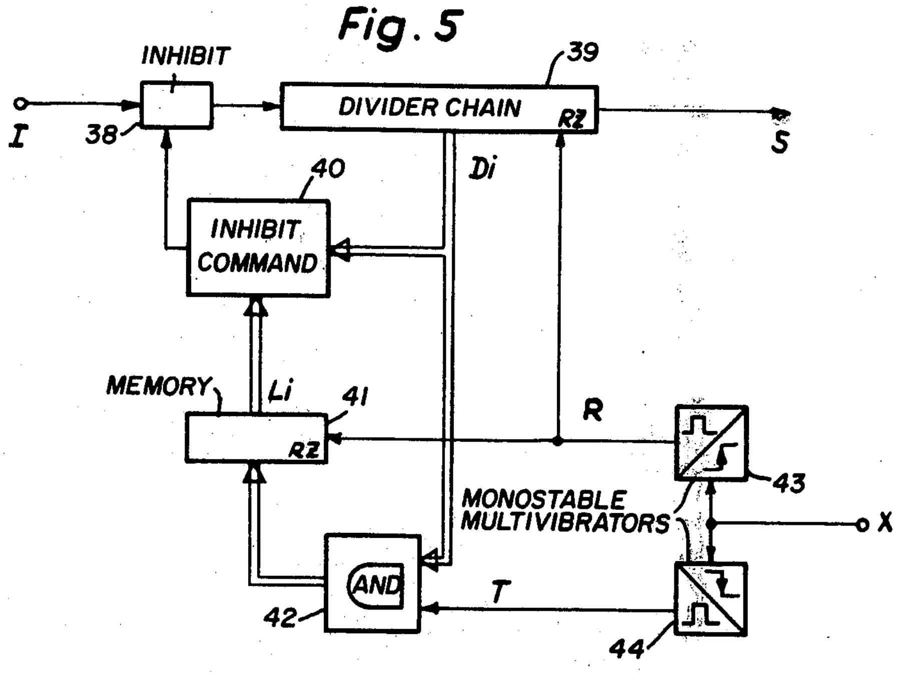
FIG. 5 is a block diagram of another embodiment of the timekeeper of FIG. 1, in which the frequency comparator and the divider are also combined.

It is also possible to provide a timekeeper with an adjustable divider similar to that described with reference to FIG. 2, but operating by inhibition. Such a timekeeper is schematically shown in FIG. 5 and operates as follows:

FIG. 5 comprises an inhibit circuit 38 with a first input I which is the input of the time-keeper, and an output controlling the divider 39 chain. This chain comprises an output S which is that of the time-keeper, a reset-to-zero input RZ for all division stages, and outputs Di of the division stages which are connected on one hand to first inputs of an inhibit control circuit 40 and on the other hand to first inputs of a circuit comprising AND gates 42. The outputs from the latter are connected to the storage inputs of memory 41, the outputs Li of which are connected to the second inputs of the inhibit control circuit 40 controlling the second input of inhibit circuit 38.

An input terminal X receiving the reference signal is connected on one hand to a single pulse generator (monostable multivibrator) 44, the output T of which is connected to the second inputs of the AND gates 42; input X is also connected to a single pulse generator (monostable) 42, the output R of which is connected to the reset-to-zero input RZ of dividers 39 and to input RZ for resetting memory 41 to zero.

The time-keeper of FIG. 5 operates as follows:

When there is no reference signal at input X, R and T will be at "0" and neither dividers 39 nor memory 41 will be affected. Inhibit control circuit 40 will command inhibit circuit 38 to inhibit a number of pulses I equal to the content of memory 41 during each period of output S. The overall division ratio of the system equals that of the dividing chain plus the value stored in the memory.

When the input signal switches to "1", the stores and dividers are set to zero, then while X has the value "1", the dividing chain counts the totality of pulses "I" (there is no inhibition since the memory content is "0").

Since the duration of the X pulse is equal to the disired output period, and no I pulse is inhibited, the chain of dividers will effect a complete cycle and begin a new cycle until disappearance of the X pulse. At the very instant when X switches back to "0". The content of this chain of dividers will be just equal to the number of pulses to be inhibited for each output period. Said content is thus transferred into the memory by means of the AND gates controlled by T.

It is not necessary to totally transfer this value if the limits within which it should be comprised are known. In our example of FIG. 2 the duration of the standard signal being one second, end the input frequency being comprised between 16 Hz and 31 Hz, it is known that the last divider ($D_5$) will be at value "1" upon transfer. It is consequently superfluous to store the value of this last divider.

The numerical values which may be involved are now given for a practical example:

Input frequency (I): comprised between 258,048 Hz and 262,144 Hz.

Output frequency (S): 0.5 Hz.

Precision of the output frequency: $10^{-6}$

The number of dividers of the chain must be twenty so that from one discrete value to another, the division ratio changes by $10^{-6}$ ($2^{20} \cong 10^6$).

the adjustment must have a duration of $$\frac{2^{20}}{262,244\ Hz} = 4 \text{ sec.}$$

The desired value of the division ratio must be comprised between $$258,048 \times 4 = 1,032,192$$

and 262,144 × 4 = 1,048,576.

The number of adjusting steps is 1,048,576 − 1,032,192 = 16,348.

The number of memory bits required is $\log_2$ 16,384 = 14.

This is equivalent to saying that the last stages of the chain of twenty dividers are necessarily at value "1" after having counted the pulses I which occur during the adjustment period of four seconds.

The circuit of this example comprises:

twenty dividing stages
fourteen RS flip-flops
fourteen transfer AND gates
one circuit allowing comparison of the state of the twenty dividers with the state 111111, $L_{14}$, . . . $L_2$, $L_1$ ($L_1$ to $L_{14}$ being the fourteen stored values).

What is claimed is:

1. A timekeeping instrument comprising a time base oscillator, an adjustable frequency divider connected to the output of said oscillator, means coupled to said divider for comparing the frequency to be adjusted of the divider output signal with a reference frequency of a standard signal, means coupled to said comparing means for computing as a function of the measured difference the value of the division ratio necessary for the divider output frequency to be equal to the reference frequency, an alterable memory coupled to said computing means for storing the output thereof, and means coupled between said memory and said divider for setting the division ratio of said divider at said computed value.

2. A timekeeping instrument, comprising: a time base oscillator; an adjustable frequency divider coupled to the output of said oscillator for dividing the frequency of the output signal generated by said oscillator; alterable memory means; first comparator means having a first input coupled to a corresponding output from said frequency divider, a second input coupled to a reference frequency signal source, and an output coupled to an input of said memory means, wherein said first comparator means includes means to compare one period of said reference frequency with the output of said divider and store the result of said comparison in said memory means; second comparator means having a first input coupled to said divider output and a second input coupled to an output from said memory means; and means coupling the output of said second comparator means to said frequency divider to adjust the divider output as a function of the information stored in said memory means.

3. An instrument according to claim 2, in which the adjustable frequency divider is a preselection counter comprising a plurality of resettable binary divider stages whose outputs are connected to first inputs of said second comparator, second inputs of said second comparator being connected to the memory outputs, and the output of said second comparator being connected to the reset inputs of the binary divider stages, said second comparator forming means for resetting said binary dividing stages to zero when the frequency divider state is equal to the content of the memory.

4. An instrument according to claim 2, wherein said second comparator comprises a portion of said frequency divider circuit.

5. An instrument according to claim 4, wherein said frequency divider comprises a plurality of binary divider stages; and further comprising an inhibit circuit interposed between said oscillator and said divider, and a control circuit having first inputs coupled to the respective outputs of said binary divider stages and second inputs coupled to corresponding outputs of said memory means, the output of said control circuit being coupled to said inhibit circuit to inhibit input pulses to said frequency divider equal to the contents of said memory means during each period of the frequency divider output signal.

* * * * *